United States Patent
Yoon et al.

(10) Patent No.: US 6,583,920 B2
(45) Date of Patent: Jun. 24, 2003

(54) METHOD OF MANUFACTURING A MICROSTRUCTURE

(75) Inventors: Yong-seop Yoon, Seoul (KR); Hyung Choi, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/995,956

(22) Filed: Nov. 29, 2001

(65) Prior Publication Data

US 2002/0064957 A1 May 30, 2002

(30) Foreign Application Priority Data

Nov. 30, 2000 (KR) .......................... 2000-72123

(51) Int. Cl.[7] .................. G02B 26/00; G02B 26/08; H01L 21/00
(52) U.S. Cl. .................. 359/290; 359/291; 359/221; 438/52
(58) Field of Search .................. 359/291, 290, 359/221, 224, 281, 230, 280; 438/52, 72

(56) References Cited

U.S. PATENT DOCUMENTS

| | | | | |
|---|---|---|---|---|
| 5,536,792 A | * | 7/1996 | Hogan et al. ............... | 525/432 |
| 5,702,565 A | * | 12/1997 | Wu et al. ................. | 156/643.1 |
| 6,181,460 B1 | * | 1/2001 | Tran et al. ................. | 359/291 |
| 6,399,426 B1 | * | 6/2002 | Capote et al. .............. | 438/127 |
| 6,407,570 B1 | * | 6/2002 | Farnsworth et al. ........ | 324/765 |
| 2001/0021058 A1 | * | 9/2001 | McClelland et al. ........ | 359/223 |
| 2002/0063261 A1 | * | 5/2002 | Zhang ........................ | 257/178 |

FOREIGN PATENT DOCUMENTS

JP 402117115 A * 5/1990 ............ H01G/4/12

* cited by examiner

Primary Examiner—Georgia Epps
Assistant Examiner—Tim Thompson
(74) Attorney, Agent, or Firm—Staas & Halsey LLP

(57) ABSTRACT

A method of manufacturing a micromirror actuator includes forming a trench on a substrate by etching, laminating a film-type organic layer on the substrate to cover but not fill the trench so that the trench is maintained hollow, and depositing and patterning a metal layer on the film-type organic layer and removing the film-type organic layer. According to the method of manufacturing a micromirror actuator, a micromirror can be easily planarized by laminating the film-type organic layer on the substrate including the trench, which reduces the cost of manufacturing the micromirror actuator and increases a reflectivity of the micromirror actuator by increasing the flatness level of the micromirror so as to enhance an optical transmission efficiency.

24 Claims, 6 Drawing Sheets

METHOD OF MANUFACTURING A MICROSTRUCTURE

CROSS-REFERENCE TO RELATED APPLICATIONS

This application claims the benefit of Korean Application No. 2000-72123, filed Nov. 30, 2000, in the Korean Industrial Property Office, the disclosure of which is incorporated herein by reference.

BACKGROUND OF THE INVENTION

1. Field of the Invention

The present invention relates to a method of manufacturing a micromirror actuator, and more particularly, to a method of manufacturing a micromirror actuator that increases a flatness of a micromirror through the lamination of a film-type organic layer and a simplified process of planarizing the micromirror.

2. Description of the Related Art

A micro optical cross connector (MOXC) as used in optical communications is a device that selects an optical path to allow an optical signal to be transmitted from a certain input terminal to a certain output terminal. The core element of the MOXC in optical communications is a micromirror. Thus, the optical communication efficiency and performance of the MOXC is strongly dependent on the reflectivity of the micromirror and the ability of the micromirror to stand erect.

Referring to FIG. 1, a conventional micromirror actuator includes a substrate 100, a trench 105 formed in the substrate 100, lower and side electrodes 110 and 113 formed at a corresponding bottom and side of the trench 105, posts 115 that protrude from the substrate 100 in an area outside the trench 105, torsion springs 120 supported by the posts 115, and a micromirror 125 elastically supported by the torsion springs 120 to be capable of rotating.

The micromirror 125 can be rotated by electrostatic forces generated through an interaction with the lower electrode 110. The micromirror 125 can stand erect due to an interaction with the side electrode 113. The micromirror 125 can also maintain its parallel state when voltage is turned off. A micromirror actuator having the above structure can select an optical path by reflecting optical signals when the micromirror 125 stands erect over the substrate 100, and also allows the optical signals to directly pass over the surface of the micromirror 125 when the micromirror 125 is parallel with the surface of the substrate 100.

When the micromirror actuator has the trench 105, it is necessary therefore to planarize the micromirror 125 to increase its reflectivity. FIGS. 2A through 2C are cross-sectional views illustrating a conventional method of manufacturing the micromirror actuator as viewed along line V—V of FIG. 1. The conventional process of planarizing the micromirror actuator includes forming the trench 105 by etching a portion of a silicon wafer 130 to a predetermined depth (shown in FIG. 2A), thickly depositing a photoresist 135 by spin coating (shown in FIG. 2B), and planarizing the photoresist 135 by chemical mechanical polishing (CMP) (shown in FIG. 2C).

However, when the photoresist 135 is planarized by CMP, a cushion phenomenon occurs causing the surface of the photoresist 135 to become irregular as shown in FIG. 3. In other words, the planarization of the photoresist 135 is performed while applying weight to the photoresist 135 in a lapping device (not shown). However, when the silicon wafer 130 is taken out from the lapping device after completing the planarization of the photoresist 135, the cushion phenomenon occurs at the photoresist 135. The cushion phenomenon occurs when a predetermined portion of the silicon wafer 130 to which weight has been applied swells up. The reason the cushion phenomenon occurs will be described in the following.

In FIG. 2B, the photoresist 135 deposited to a predetermined thickness h on the silicon wafer 130 is soft. In addition, the height of the photoresist 135 deposited over the trench 105 is less than the height of the photoresist 135 deposited outside the trench 105 by as much as a height difference of h'. Accordingly, the photoresist 135 deposited over the trench 105 is slightly recessed when the photoresist 135 is polished by CMP to planarize its surface.

After polishing of the photoresist 135, the hardness of the resulting structure in a trench region becomes different from the hardness of the resulting structure outside the trench region. In other words, the lengthwise hardness of the structure including the photoresist 135 and the silicon wafer 130 in the trench region is equal to the sum of the hardness of photoresist $135t_1$ remaining over the trench 105 after the CMP, the hardness of photoresist $135t_2$ filling the trench 105, and the hardness of a lower wafer $130t$ under the photoresist $135t_2$. On the other hand, the lengthwise hardness of the structure outside the trench region is equal to the sum of the hardness of photoresist $135n$ remaining on the silicon wafer 130 outside the trench 105 after the CMP and the hardness of a lower silicon wafer $130n$ under the photoresist $135n$. Here, since the hardness of the silicon wafer 130 is greater than the hardness of the photoresist 135, the lengthwise hardness of the structure including the photoresist 135 and the silicon wafer 130 is greater outside the trench region than in the trench region. Accordingly, the photoresist 135 expands more in the region of the trench 105 than in the region around the trench 105, producing a swell C on the surface of the photoresist 135 as shown in FIG. 3. This swelling effect is referred to as the cushion phenomenon.

As described above, if the CMP that is usually applied to silicon is directly performed on the photoresist 135 deposited over the trench 105, the photoresist 135 cannot be planarized because of the cushion phenomenon. In order to properly planarize the photoresist 135, the CMP must therefore be performed twice. Accordingly, the costs of the planarization increases, the reflectivity of the micromirror may deteriorate, and an optical loss may increase.

SUMMARY OF THE INVENTION

To solve the above and other problems, it is an object of the present invention to provide a method of manufacturing a micromirror actuator that increases a flatness of a micromirror by laminating a film-type polyimide layer, enhances a reflectivity of the micromirror, and simplifies a process of planarizing the micromirror.

Additional objects and advantages of the invention will be set forth in part in the description which follows and, in part, will be obvious from the description, or may be learned by practice of the invention.

Accordingly, to achieve the above and other objects, a method of manufacturing a micromirror actuator according to an embodiment of the invention includes forming a trench on a substrate by etching, laminating a film-type organic layer on the substrate to cover but not fill the trench so that the trench remains hollow, depositing and patterning a metal layer on the film-type organic layer, and removing the film-type organic layer.

According to another embodiment of the invention, the method further includes forming a lower electrode and a side electrode by depositing and patterning an insulating layer and a metal layer on the substrate after forming the trench region, forming post holes by patterning the film-type organic layer after laminating the film-type organic layer, and forming a micromirror, torsion springs, and posts by patterning the metal layer on the film-type organic layer, and removing the film-type organic layer.

BRIEF DESCRIPTION OF THE DRAWINGS

The above and other objects and advantages of the present invention will become more apparent and more readily appreciated by describing in detail preferred embodiments thereof with reference to the accompanying drawings in which.

DETAILED DESCRIPTION OF THE EMBODIMENTS

Figure 1:
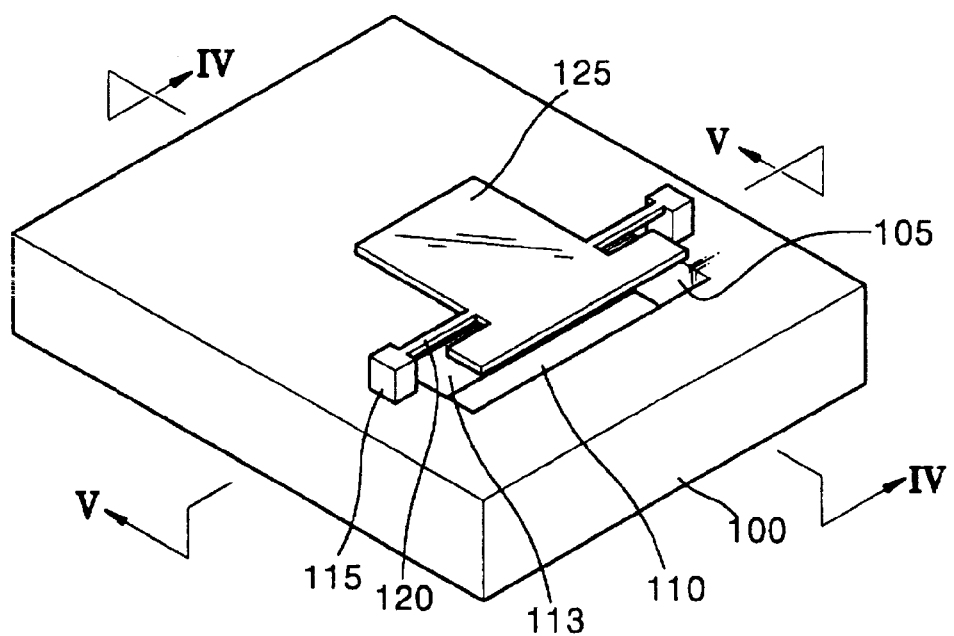
FIG. 1 is a perspective view illustrating a conventional micromirror actuator.
Figure 2A:
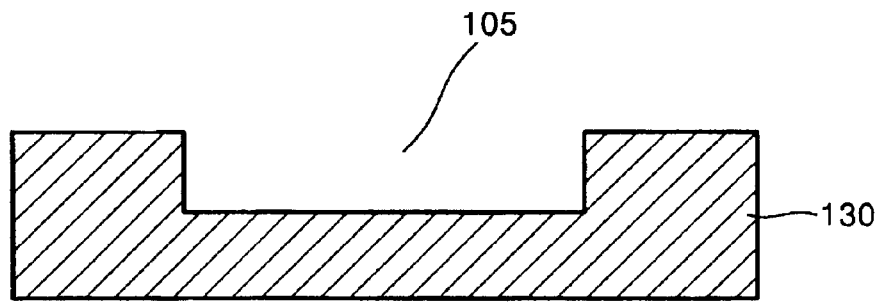
FIGS. 2A through 2C are cross sectional-views illustrating a conventional method of manufacturing the micromirror actuator.
Figure 2B:
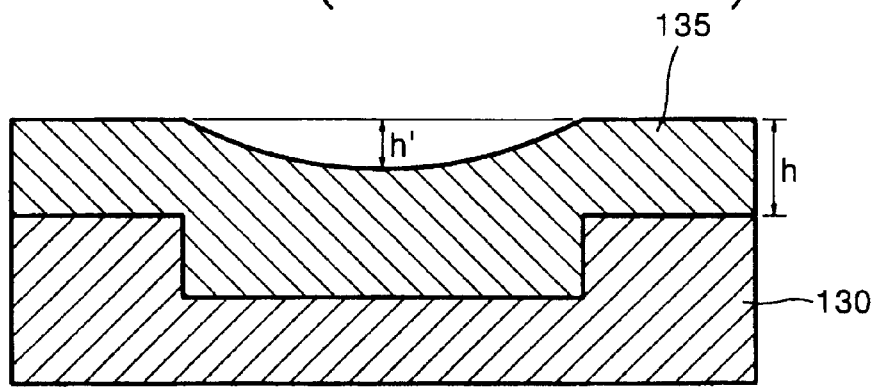
Figure 2C:
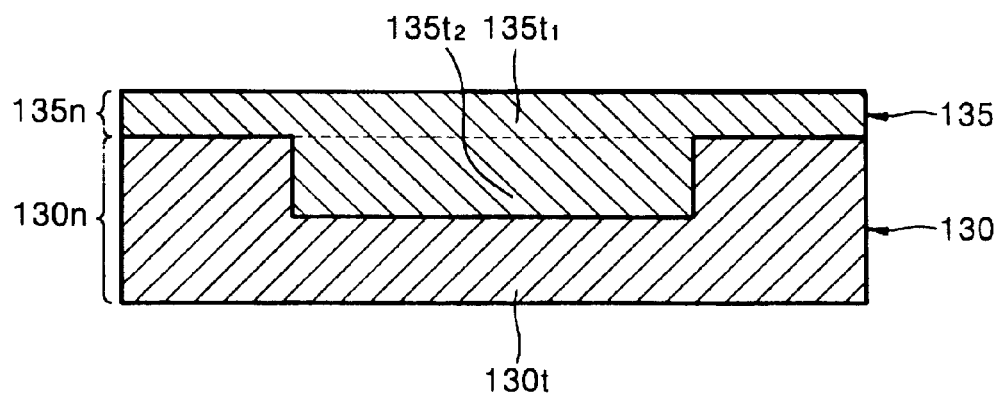
Figure 3:
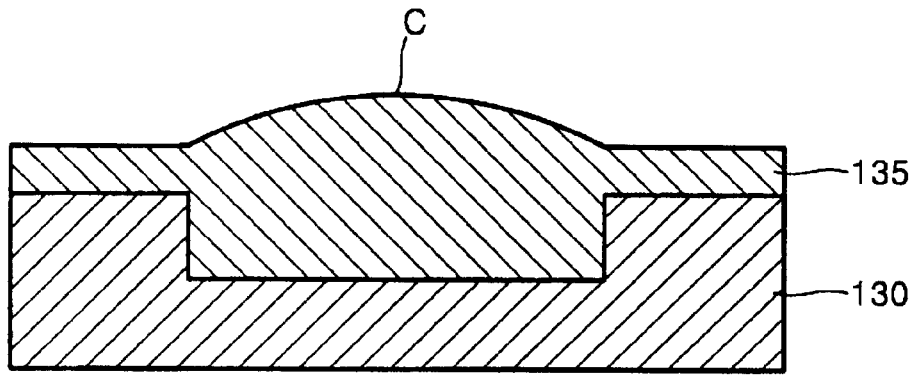
FIG. 3 is a cross-sectional view explaining a cushion phenomenon occurring due to the conventional method shown in FIGS. 2A through 2C.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 4A:
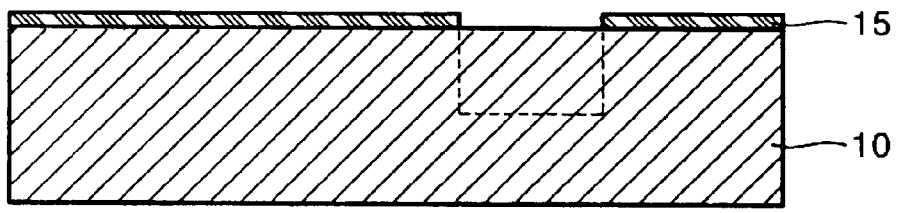
FIGS. 4A through 4H are cross-sectional views illustrating a method of manufacturing a micromirror actuator according to an embodiment of the present invention viewed along line IV—IV of FIG. 1.
Figure 4B:
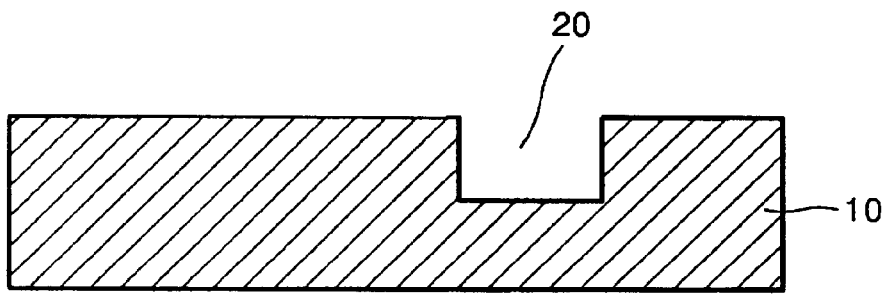
Figure 4C:
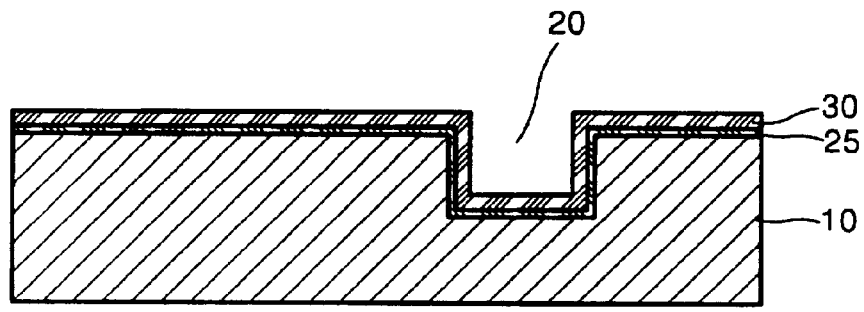
Figure 4D:
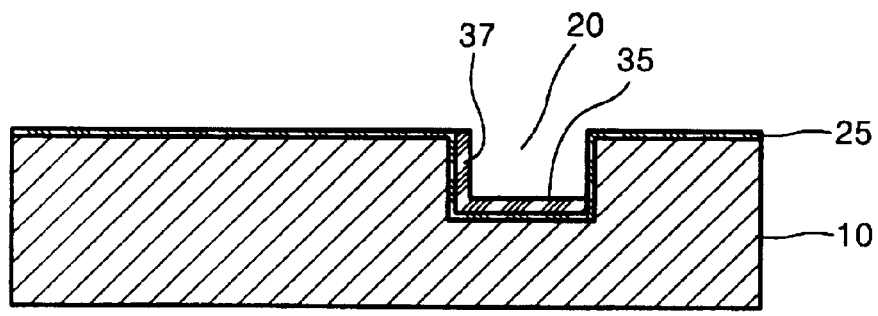

As shown in FIGS. 4A and 4B, a photoresist 15 is deposited on a substrate 10 and is patterned into a trench 20 by photolithography. Next, the photoresist 15 is removed leaving the trench 20. As shown in FIG. 4C, an insulating layer 25 and a metal layer 30 are deposited on the substrate 10 and are patterned into a lower electrode 35 and a side electrode 37 by photolithography as shown in FIG. 4D.

Figure 4E:
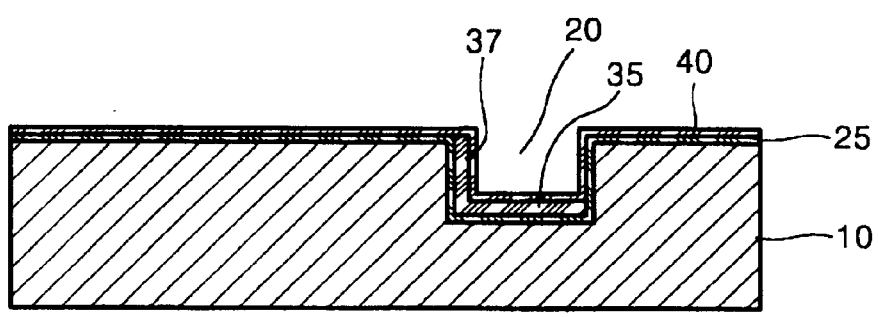
Figure 4F:
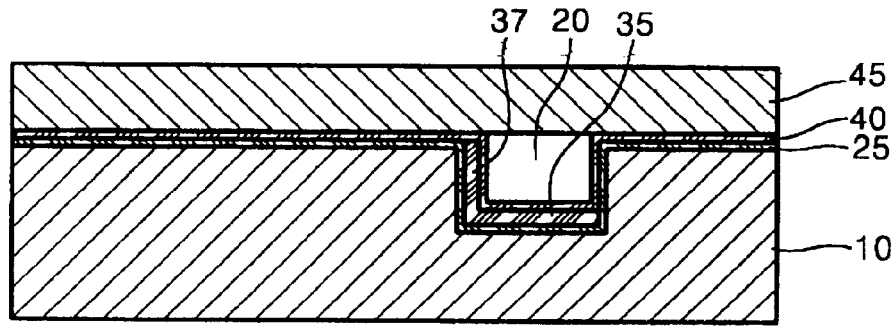

As shown in FIG. 4E, an insulating layer 40 is deposited over the entire structure. As shown in FIG. 4F, a film-type organic layer 45 is laminated on the insulating layer 40 to cover but not fill the trench 20 by applying heat and pressure to the film-type organic layer 45. Here, since the trench 20 is maintained hollow after the lamination of the film-type organic layer 45, the resulting structure can be easily planarized. The film-type organic layer 45 is formed of a polyimide-based material, but can be any material capable of forming a temporary layer over the trench 20.

Here, the thickness of the film-type organic layer 45 may vary. However, the thinner the film-type organic layer 45, the narrower the gap between the lower electrode 35, the side electrode 37, and a micromirror 125. In addition, as the gap among the lower electrode 35, the side electrode 37, and the micromirror 125 becomes narrower, the attractive electrostatic forces between the electrodes 35, 37, and the micromirror 125 become greater to thus generate a strong driving force. Therefore, the thinner the film-type organic layer 45, the better.

According to another embodiment of the invention, the film-type organic layer 45 is formed by laminating a thick organic layer 45 on the insulating layer 40, and thinning the organic layer by ashing or dry etching to reduce the thickness of the organic layer 45.

Figure 4G:
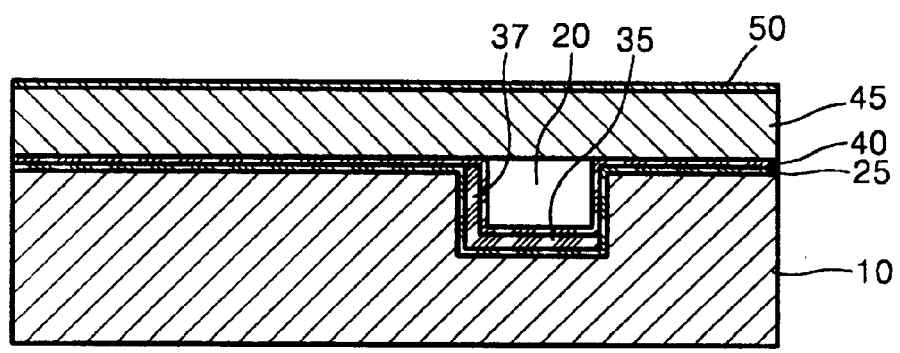
Figure 4H:
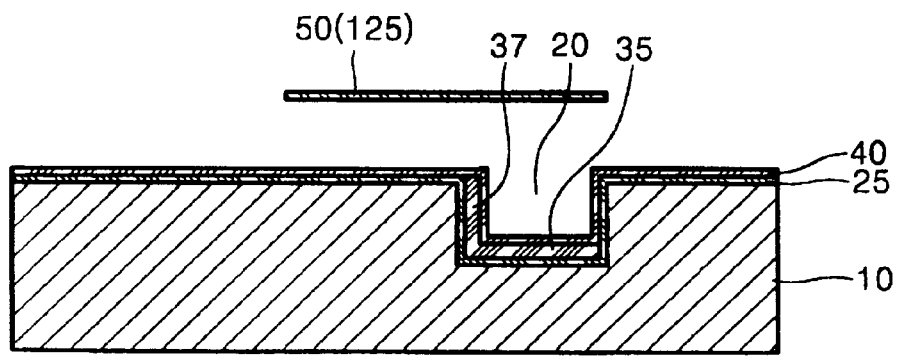

As described above, after the planarization of the organic layer 45, a metal layer 50 is deposited on the film-type organic layer 45 and is patterned by photolithography as shown in FIGS. 4G and 4H. Next, the film-type organic layer 45 is removed by isotropic dry etching, thereby forming the micromirror 125 of FIG. 1 and the torsion springs 120 of FIG. 1.

Figure 5A:
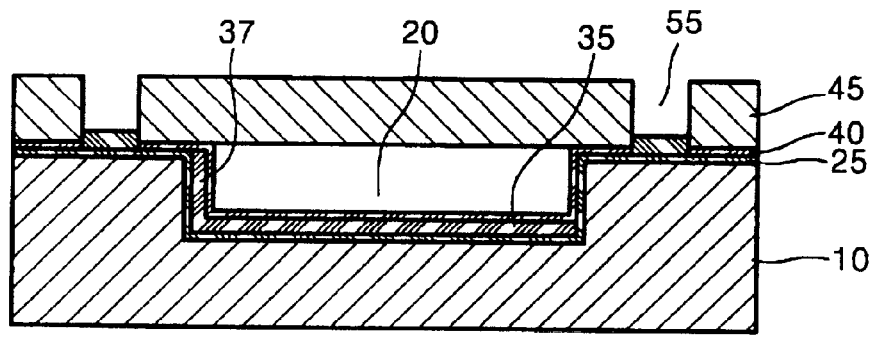
FIGS. 5A through 5C are cross-sectional views illustrating the method of manufacturing the micromirror actuator according to an embodiment of the present invention viewed along line V—V of FIG. 1.
Figure 5B:
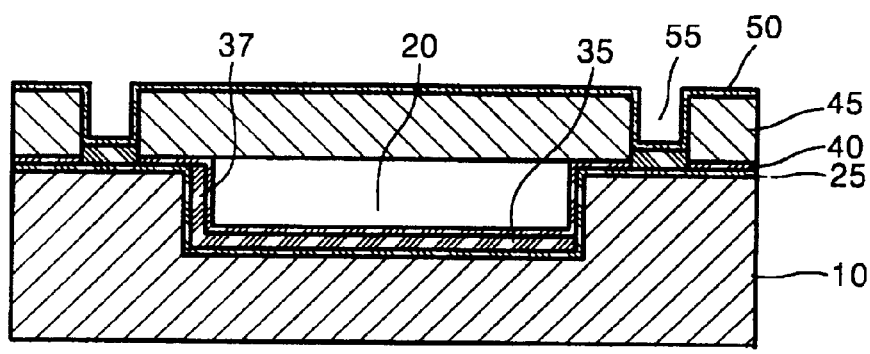
Figure 5C:
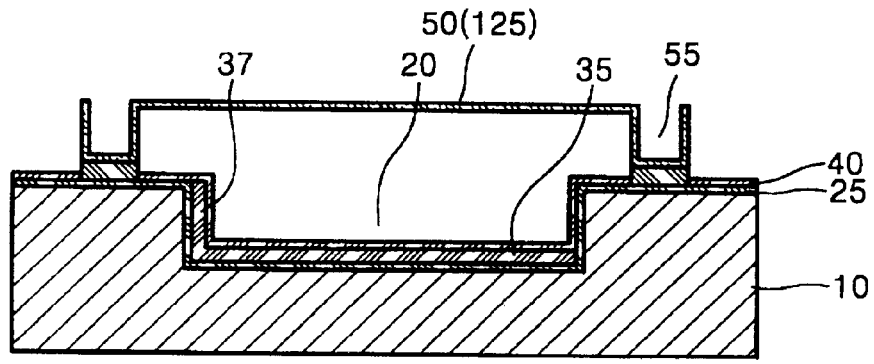

FIGS. 5A through 5C are cross-sectional views illustrating the method of manufacturing the micromirror actuator as viewed along line V—V of FIG. 1. The manufacturing operations illustrated in FIGS. 5A through 5C correspond to the manufacturing operations illustrated in FIGS. 4F through 4H. After the lamination of the film-type organic layer 45 as shown in FIG. 5A, the film-type organic layer 45 is patterned by photolithography and etched to form post holes 55. As shown in FIGS. 4G and 5B, the metal layer 50 is deposited on the film-type organic layer 45 as well as being deposited in the post holes 55. the deposited metal layer 50 is then patterned. Next, the film-type organic layer 45 is removed, thereby forming the micromirror 125, the torsion springs 120, and the posts 115 shown in FIG. 1.

As described above, according to the present invention, a micromirror can be easily planarized by laminating a film-type organic layer on a substrate including a trench, which reduces the cost of manufacturing the micromirror actuator. In addition, the method makes it possible to increase a reflectivity of the micromirror actuator by increasing the flatness of the micromirror and thus enhancing the optical transmission efficiency.

While not shown, it is understood that other methods of microfabrication can be used instead of or in addition to photolithography, and that other materials can be used for the post, springs, and micromirror. Further, it is understood that the present invention can be applied to the manufacture of any microstructure using a semiconductor process, whereby an uneven surface of the microstructure is thereby planarized by laminating a film-type organic layer over the uneven surface.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a micromirror actuator comprising:

etching to from a trench on a substrate;

laminating a film-type organic layer on the substrate to cover but not fill the trench so that the trench remains hollow;

depositing and patterning a metal layer on the film-type organic layer; and removing the film-type organic layer.

2. The method of claim 1 further comprising:
forming a lower electrode and a side electrode by depositing and patterning an insulating layer and another metal layer on the substrate after said etching the trench region;
forming post holes by patterning the laminated film-type organic layer; and
forming a micromirror, torsion springs, and posts by patterning the metal layer deposited on the film-type organic layer including in the formed post holes and removing the film-type organic layer.

3. A method of manufacturing a micromirror actuator comprising:
forming a temporary layer on a substrate having a trench, where the temporary layer covers but does not fill the trench;
depositing and patterning a metal layer on the temporary layer; and
removing the temporary layer.

4. The method of claim 3, wherein said forming the temporary layer comprises laminating the temporary layer on the substrate.

5. The method of claim 3, wherein the temporary layer comprises a film-type organic layer.

6. The method of claim 5, wherein the film-type organic layer comprises a polyimide-based material.

7. The method of claim 5, wherein said laminating the film-type organic layer comprises applying heat and pressure to the film-type organic layer.

8. The method of claim 5, further comprising reducing a thickness of the laminated film-type organic layer prior to said depositing and patterning the metal layer.

9. The method of claim 8, wherein said reducing the thickness comprises reducing the thickness using one of an ashing process and a dry etching process.

10. The method of claim 3, further comprising, prior to said forming the temporary layer, etching the substrate to form the trench.

11. The method of claim 10, wherein said etching the substrate comprises:
forming a photoresist on the substrate to have a gap over a trench region,
forming the trench at the gap in the photoresist using photolithography, and
removing the photoresist.

12. The method of claim 3, further comprising:
prior to said forming the temporary layer, depositing and patterning an insulating layer and another metal layer on the substrate to form a lower electrode and a side electrode within the trench,
wherein said depositing and patterning the metal layer comprises forming and patterning the metal layer on the temporary layer so as to form one of a micromirror, torsion springs, and posts when the temporary layer is removed.

13. The method of claim 12, wherein said depositing and pattering the insulating layer and the metal layer comprises patterning the insulating layer and the metal layer by photolithography.

14. The method of claim 12, further comprising forming another insulating layer over the deposited and patterned insulating and metal layer prior to forming the temporary layer.

15. The method of claim 12, further comprising patterning the temporary layer after said forming the temporary layer,
wherein said depositing and patterning the metal layer comprising using the patterned temporary layer to form the one of a micromirror, torsion springs, and posts when the temporary layer is removed.

16. The method of claim 15, wherein:
said patterning the temporary layer comprises forming holes in the temporary layer, and
the using the patterned temporary layer comprises forming the metal layer over the formed holes and patterning the metal layer to form the posts extending from the substrate.

17. The method of claim 16, wherein said depositing and patterning the metal layer further comprises forming and patterning the metal layer so as to form the micromirror attached to the formed posts by the torsion springs when the temporary layer is removed.

18. The method of claim 3, wherein said removing the temporary layer comprises removing the temporary layer using an isotropic dry etching process.

19. A micromirror actuator comprising:
a substrate having a trench;
electrodes disposed on corresponding sides of the trench;
posts extending from said substrate;
a micromirror disposed over the trench; and
springs to elastically support said micromirror between said posts,
wherein said micromirror is manufactured according to the method of claim 3.

20. The micromirror of claim 19, wherein said posts and said springs are manufactured according to the method of claim 17.

21. A method of manufacturing a microstructure using a semiconductor process, comprising:
laminating a film-type organic layer on an uneven layer deposited during the manufacture of the microstructure to planarize the uneven layer,
wherein the laminating the film-type organic layer on the uneven layer comprises laminating the film-type organic layer on the uneven layer deposited during the manufacture of the microstructure to planarize the uneven layer so as to define a void between the organic layer and the uneven layer.

22. The method of claim 21, further comprising forming a second layer on the organic layer, and removing the organic layer without removing a portion of the second layer disposed over the void.

23. The method of claim 22, further comprising patterning the second layer so as to form a first portion and a suspension portion such that, after removing the organic layer, the first portion is suspended over the void by the suspension portion.

24. The method of claim 23, wherein the suspension portion comprises torsional springs disposed between the uneven layer and the first portion.

* * * * *